US010422030B2

(12) United States Patent
Bucci et al.

(10) Patent No.: US 10,422,030 B2
(45) Date of Patent: Sep. 24, 2019

(54) APPARATUS AND METHOD FOR PLANARIZING MULTIPLE SHADOW MASKS ON A COMMON CARRIER FRAME

(71) Applicant: Advantech Global, LTD, Road Town (VG)

(72) Inventors: Brian Arthur Bucci, Pittsburgh, PA (US); David N. Monto, McKees Rocks, PA (US); Shen-Chih Tung, Pittsburgh, PA (US)

(73) Assignee: Advantech Global, LTD, Road Town, Tortola (VG)

( * ) Notice: Subject to any disclaimer, the term of this patent is extended or adjusted under 35 U.S.C. 154(b) by 0 days.

(21) Appl. No.: 16/062,395

(22) PCT Filed: Dec. 20, 2016

(86) PCT No.: PCT/US2016/067783
§ 371 (c)(1),
(2) Date: Jun. 14, 2018

(87) PCT Pub. No.: WO2017/136058
PCT Pub. Date: Aug. 10, 2017

(65) Prior Publication Data
US 2018/0363127 A1     Dec. 20, 2018

Related U.S. Application Data

(60) Provisional application No. 62/290,096, filed on Feb. 2, 2016.

(51) Int. Cl.
*G01B 11/00*     (2006.01)
*C23C 14/04*     (2006.01)
(Continued)

(52) U.S. Cl.
CPC ............ *C23C 14/042* (2013.01); *C23C 14/04* (2013.01); *C23C 14/54* (2013.01); *C23C 16/04* (2013.01);
(Continued)

(58) Field of Classification Search
CPC . G03F 9/70; G03F 9/7088; G03F 9/00; G01B 11/272; H01L 21/681
(Continued)

(56) References Cited

U.S. PATENT DOCUMENTS

2002/0102754 A1     8/2002 Fujimori et al.
2005/0012914 A1     1/2005 Lin
(Continued)

*Primary Examiner* — Md M Rahman
(74) *Attorney, Agent, or Firm* — The Webb Law Firm

(57) ABSTRACT

In an apparatus and method for multi mask alignment, a carrier is provided that includes apertures therethrough. For each aperture, a combination frame and shadow mask that includes alignment features is positioned on spacers supported by the carrier with the shadow mask of the combination in coarse alignment with the aperture. Next, each combination frame and shadow mask is moved to a position spaced from the spacers whereupon the alignment system, under the control of a controller, individually aligns each combination frame and shadow mask to align the alignment features of the combination with reference alignment features associated with the combination. Each combination frame and shadow mask is then returned to a position on the spacers whereafter each combination frame and shadow mask is secured to the carrier. In an example, all of the combination frames and shadow masks can be aligned simultaneously.

20 Claims, 17 Drawing Sheets

(51) Int. Cl.
  *C23C 16/04*    (2006.01)
  *C23C 14/54*    (2006.01)
  *G01B 11/27*    (2006.01)
  *H01L 51/00*    (2006.01)

(52) U.S. Cl.
  CPC ........ *G01B 11/272* (2013.01); *H01L 51/0011* (2013.01)

(58) Field of Classification Search
  USPC ........................................................ 356/400
  See application file for complete search history.

(56)  References Cited

U.S. PATENT DOCUMENTS

2009/0311427 A1    12/2009  Marcanio et al.
  2013/0342843 A1    12/2013  Tamura
  2014/0170785 A1     6/2014  Kurita et al.
  2014/0345124 A1*   11/2014  Patzner ................ H05K 3/325
                                                              29/837
  2015/0024147 A1     1/2015  Lee et al.
  2015/0026953 A1     1/2015  Webb et al.

* cited by examiner

APPARATUS AND METHOD FOR PLANARIZING MULTIPLE SHADOW MASKS ON A COMMON CARRIER FRAME

CROSS REFERENCE TO RELATED APPLICATIONS

This application claims the benefit of U.S. Provisional Patent Application No. 62/290,096, filed Feb. 2, 2016, the contents of which are incorporated herein in its entirety by reference.

BACKGROUND OF THE INVENTION

Field of the Invention

The present invention relates to planarizing each instance of a combination frame and shadow mask mounted on a carrier frame as well as planarizing a number of combination frames and shadow masks mounted on the carrier frame with respect to each other.

Description of Related Art

In the field of shadow mask vapor deposition, there is a trend to utilize increasingly larger area shadow masks that include one or more openings corresponding to a desired pattern of material to be deposited on a substrate from a deposition source. A problem, however, with forming increasingly larger area sized shadow masks is in avoiding run-on errors in positioning of openings across the dimensions of the shadow mask. Stated differently, a problem with forming increasingly larger area sized shadow masks is that it becomes increasingly more difficult to maintain accurate dimensional stability between openings used for depositing patterns of material on a substrate across the dimensions of the shadow mask.

One proposal to overcome this problem is disclosed in PCT/US2015/055517, filed Oct. 14, 2015, entitled "Multi-Mask Alignment System and Method" (hereinafter "the PCT application"), wherein a number of shadow masks are individually oriented and mounted on a carrier frame. PCT/US2015/055517 is incorporated herein by reference.

A challenge with the approach disclosed in the PCT application is in ensuring that each individual shadow mask of the number of shadow masks is properly oriented on the carrier frame, which may not have a flat or planar surface on which to mount the shadow masks. Absent the carrier frame having such flat or planar surface, there exists the possibility that contacting surfaces of each shadow mask and a substrate on which a deposition event is to occur are not parallel, or not substantially parallel, whereupon one or more unintentional gaps form between said surfaces whereupon, during a deposition event via apertures in the shadow mask, material being vapor deposited can undesirably enter such gaps and be deposited on one or both of the surfaces of the shadow mask and the substrate defining said gaps, an undesirable condition.

SUMMARY OF THE INVENTION

Various preferred and non-limiting examples or aspects of the present invention will now be described and set forth in the following numbered clauses:

Clause 1: A multi-mask alignment system comprises a carrier including first and second sides and a plurality of apertures extending through the carrier from the first side to the second side, wherein each aperture has associated therewith a combination frame and shadow mask including alignment features, wherein the shadow mask is supported via the frame on the first side of the carrier with the shadow mask in alignment with the aperture. An alignment system is positioned on the second side of the carrier and a controller is operative for controlling the alignment system to individually align each combination frame and shadow mask such that the alignment features of said combination align with reference alignment features associated with said combination but not part of the carrier or said combination. Spacers are positioned on the carrier and configured to support each combination frame and shadow mask above a surface of the first side of the carrier.

Clause 2: The system of clause 1, wherein the spacers can be configured to planarize each combination frame and shadow mask.

Clause 3: The system of clause 1 or 2, wherein the spacers can be configured to planarize all of the combination frames and shadow masks with respect to each other.

Clause 4: The system of any one of clauses 1-3, wherein the spacers can comprise leveling pins projected through openings in the carrier and the leveling pins can be secured in the openings in the carrier.

Clause 5: The system of any one of clauses 1-4, wherein the leveling pins can be secured in the openings in the carrier via bonding or press fit.

Clause 6: The system of any one of clauses 1-5 can further include at least one camera operative for acquiring images that can include the alignment features, wherein the controller can be operative for controlling the alignment system based on the acquired images.

Clause 7: The system of any one of clauses 1-6, wherein the reference alignment features can comprise reference coordinates stored in a memory and the controller can control the alignment system to align the alignment features in the acquired images to the reference coordinates.

Clause 8: The system of any one of clauses 1-7 can further include an alignment substrate, including the reference alignment features, positioned between the at least one camera and the combination frame and shadow mask, wherein the acquired images can also include the reference alignment features.

Clause 9: The system of any one of clauses 1-8 can further include an alignment substrate, including the reference alignment features, positioned to a side of the combination frame and shadow mask opposite the carrier, wherein the alignment features and the reference alignment features can include a first plurality of holes and a second plurality of holes, respectively. The controller can be operative for controlling the alignment system to individually align each combination frame and shadow mask until a predetermined amount of light passes through the first plurality of holes of said combination and the second plurality of holes associated with said combination in alignment with said first plurality of holes of said combination.

Clause 10: The system of any one of clauses 1-9, wherein each hole of the first plurality of holes aligned with one hole of the second plurality of holes can be positioned along a light path. Each light path can comprise a light receiver and the controller can determine from the outputs of the light receivers when the predetermined amount of light passes through the first plurality of holes and the second plurality of holes in alignment with said first plurality of holes.

Clause 11: The system of any one of clauses 1-10, wherein each light path can further comprise a light source.

Clause 12: The system of any one of clauses 1-11, wherein the alignment system can include an alignment stage operative: for moving at least one combination frame and shadow mask from a position in contact with the carrier to a position spaced from the carrier and vice versa, and for adjusting the combination frame and shadow mask in two or more of the X, Y, and θ direction, wherein the X and Y directions can be parallel to the first side of the carrier and the θ direction can be rotational around a Z direction which is normal of the first side of the carrier.

Clause 13: The system of any one of clauses 1-12, wherein the alignment stage can include a plurality of pins extending through holes in the carrier. When extended, the pins can position the combination frame and shadow mask spaced from the carrier. When the pins are retracted the combination frame and shadow mask can be in contact with the spacers.

Clause 14: The system of any one of clauses 1-13, wherein the controller can be operative for controlling the alignment system to simultaneously align each combination frame and shadow mask.

Clause 15: A multi-mask alignment method comprises: (a) providing a carrier that includes a plurality of apertures therethrough; (b) for each aperture, positioning a combination frame and shadow mask that includes alignment features on spacers supported by the carrier with the shadow mask of said combination in coarse alignment with the aperture; (c) following step (b), an alignment system moving each combination frame and shadow mask to a position spaced from the spacers; (d) following step (c), the alignment system individually fine or precision aligning each combination frame and shadow mask to align the alignment features of said combination with reference alignment features associated with said combination and not part of the carrier or the combination; (e) following step (d), returning each combination frame and shadow mask to a position on the spacers; and (f) following step (e), securing each combination frame and shadow mask to the carrier, wherein at least step (d) is automatically performed under the control of a controller.

Clause 16: The method of clause 15, wherein step (d) can further include simultaneously fine or precision aligning each combination frame and shadow mask.

Clause 17: The system of clause 15 or 16, wherein the spacers can be configured to planarize (i) each combination frame and shadow mask or (ii) all of the combination frames and shadow masks with respect to each other.

Clause 18: The system of any one of clauses 15-17, wherein the spacers can comprise leveling pins projected through openings in the carrier and the leveling pins can be secured in the openings in the carrier.

Clause 19: The method of any one of clauses 15-18, wherein the reference alignment features associated with said combination can comprise predetermined coordinates stored in a memory. A camera can be operative for acquiring images of the alignment features of said combination and step (d) can include the controller controlling the alignment system to align the alignment features of said combination to the predetermined coordinates based on the acquired images.

Clause 20: The method of any one of clauses 15-19, wherein an alignment substrate can be positioned between a camera and the combination frame and shadow mask and can include the reference alignment features associated with said combination. The camera can be operative for acquiring images of the alignment features of said combination and the reference alignment features associated with said combination and step (d) can include the controller controlling the alignment system to align the alignment features associated with said combination and the reference alignment features associated with said combination based on the acquired images.

Clause 21: The method of any one of clauses 15-20, wherein an alignment substrate, including the reference alignment features, can be positioned to a side of the combination frame and shadow mask opposite the carrier, wherein the alignment features and the reference alignment features can include a first plurality of holes and a second plurality of holes, respectively. Step (d) can include the controller controlling the alignment system to individually align each combination frame and shadow mask until a predetermined amount of light passes through the first plurality of holes of said combination and the second plurality of holes associated with said combination in alignment with said first plurality of holes of said combination.

Clause 22: The method of any one of clauses 15-21, wherein each hole of the first plurality of holes aligned with one hole of the second plurality of holes can be positioned along a light path. Each light path can comprise a light receiver. Step (d) can include the controller determining from the outputs of the light receivers when the predetermined amount of light passes through the first plurality of holes of said combination and the second plurality of holes associated with said combination in alignment with said first plurality of holes of said combination.

DESCRIPTION OF THE INVENTION

Figure 1:
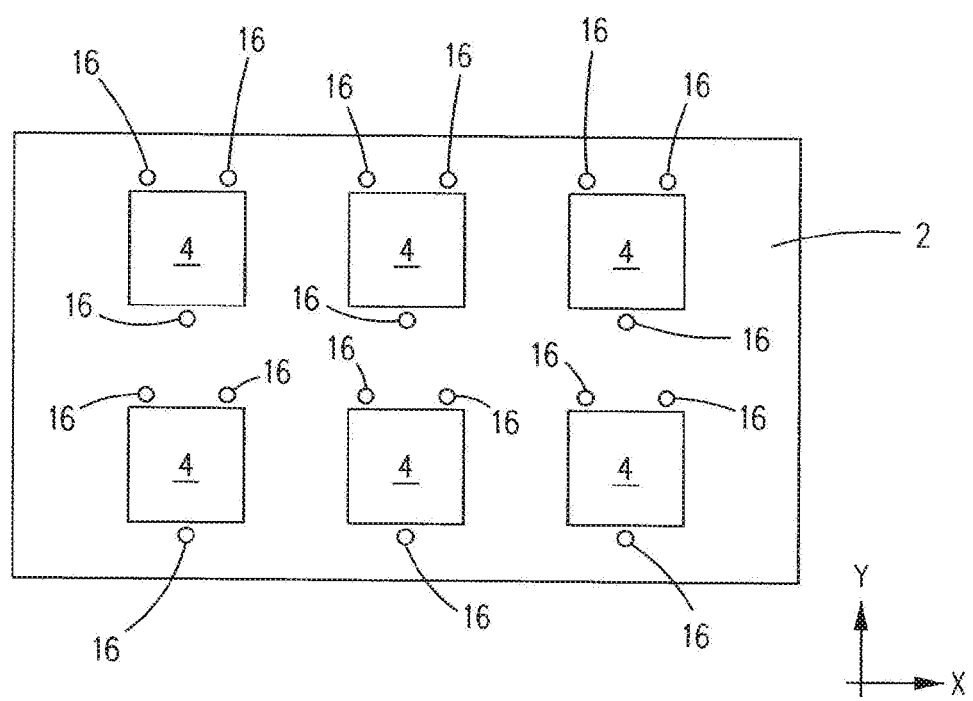
FIG. 1 is a schematic plan view of a carrier frame of a multi-shadow mask alignment system.

Various non-limiting examples will now be described with reference to the accompanying figures where like reference numbers correspond to like or functionally equivalent elements.

The various example multi-mask alignment systems described herein enable construction of an effectively larger area shadow mask out of a number of smaller area shadow masks. By constructing the effectively larger area shadow mask out of smaller area shadow masks, it is possible to maintain greater geometrical precision of the holes and apertures in the smaller shadow masks over a larger area, e.g., over an area larger than each smaller shadow mask alone. Since each small shadow mask is independent of the other small shadow masks, it is also possible to properly size the holes and apertures of each small shadow mask without affecting the dimensions of the other small shadow mask.

The various example multi-mask alignment systems described herein provide for aligning a number of small area shadow masks (one, or two, or more at a time; or all simultaneously) to form an effectively larger area shadow mask. There is no specific limit to the number of small shadow masks that can be used to form the effectively larger shadow mask.

The basic method of operation of each example multi-mask alignment system is to perform fine or precision alignment of each small shadow mask independent of each other small shadow mask. The alignment of each small shadow mask can be done with reference to alignment features associated with an alignment substrate, such as a glass plate, and alignment features associated with the small shadow masks; or by comparing alignment features associated with the small shadow masks with predetermined coordinates stored in a memory of a controller using a coordinate measuring machine (CMM) approach.

If utilizing the CMM approach, the alignment features on the small shadow masks, positioned in coarse (or general) alignment on a carrier frame, are compared to the predetermined coordinates stored in a memory of the controller. The coordinates can be stored in, for example, a drawing file, such as a CAD file, or in any suitable and/or desirable file type that facilitates the controller acquiring digital images of the small shadow masks via one or more digital (CCD) cameras and comparing the alignment features in the acquired digital images of the small shadow masks to the predetermined coordinates stored in the memory of the controller. In an example, each predetermined coordinate can include a digital representation of the corresponding alignment feature acquired from an image, whereupon the controller aligns the alignment feature in an acquired image with the digital representation of the alignment feature. However, this is not to be construed in a limiting sense.

If using the alignment substrate approach, the alignment substrate is located in spaced relation above the small shadow masks, which are positioned in coarse (or general) alignment on the carrier frame, with a gap between the bottom of the alignment substrate and the top of the small shadow masks. One or more digital (CCD) cameras are positioned above the alignment substrate to acquire images of the alignment features on the shadow masks and the alignment features of the alignment substrate. In an example, the alignment features on the shadow masks and the alignment features of the alignment substrate can be complementary. For example, the alignment features of the alignment substrate can include a pattern of solid disk or circles while the alignment features of the small shadow mask can include a pattern of open holes or rings, each of which is larger than the corresponding disk or circle on the alignment substrate. Thus, alignment could be quantified by measuring the position of each disk or circle within a hole or ring.

If using the CCM approach, each small shadow mask includes alignment features. However, instead of comparing these alignment features to marks on the alignment substrate, the absolute coordinates of the alignment features on the small shadow masks can be compared to the predetermined coordinates for the alignment features stored in the file in the memory of the controller. In this way, the alignment features on each small shadow mask can be used to compute the alignment of the small shadow masks relative to each other.

During alignment using the alignment substrate approach or the CCM approach, a mask frame supporting each small shadow mask is lifted by pins of an alignment stage that is part of an alignment system positioned, in an example, below the carrier frame. The carrier frame includes holes, or apertures, or openings to allow the pins to pass through the carrier frame and perform this operation. Each small mask frame is lifted (in the Z direction) off the surface of the carrier frame high enough to allow motion in the X, Y and/or θ directions, but not high enough to contact the bottom of the alignment substrate, if present. When using the alignment substrate approach, alignment between alignment features of each small shadow mask and corresponding alignment features of the alignment substrate is performed. In the case of the CCM approach, contact with the alignment substrate is not of concern because it is not present. However, it is still desirable to only lift the mask frames a small distance to avoid measurement error.

Each small shadow mask and mask frame combination can be aligned independently of each other small shadow mask and frame combination. This may be accomplished by an alignment system that includes an alignment stage that aligns a number of small shadow masks and frames or by an alignment system that includes one alignment stage per small shadow mask and frame. The number of alignment stages utilized to align the small shadow masks is not to be construed in a limiting sense.

After fine or precision alignment of each small shadow mask and frame comprising the large shadow mask is complete, the small shadow masks and frames are lowered back to the carrier frame. If present, the alignment substrate can be removed. Finally, the fine or precision aligned mask frames can be bonded to the carrier frame by any suitable or desirable means, such as, without limitation, adhesive or welding.

A first example multi-mask alignment system will now be described with reference to FIGS. 1-5.

The first example multi-mask alignment system includes a carrier (or carrier frame) 2 (FIG. 1) having a plurality of apertures 4 therethrough. Associated with each aperture 4 is a frame 6 supporting a shadow mask 8 (FIGS. 2 and 3) which includes one or more apertures (not shown) therethrough in a pattern corresponding to a desired pattern of material(s) desired to be vapor deposited through said apertures in said shadow mask 8.

Figure 2:
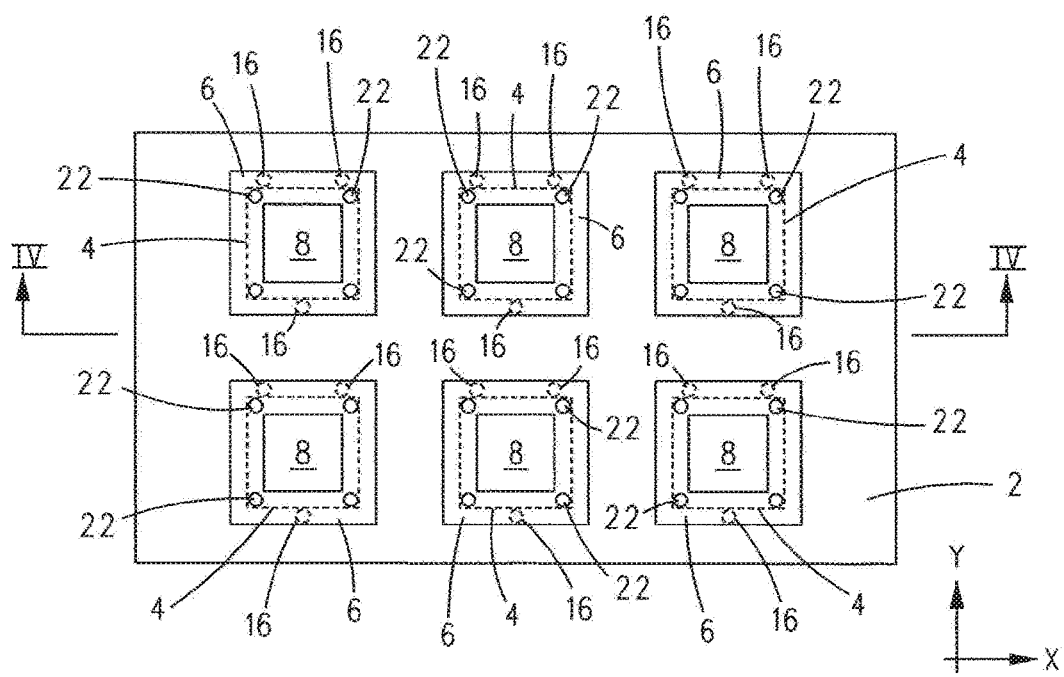
FIG. 2 is a schematic plan view of plural combination frames and shadow masks positioned on the carrier frame of FIG. 1, with each shadow mask positioned in alignment with an aperture in the carrier frame.
Figure 3:
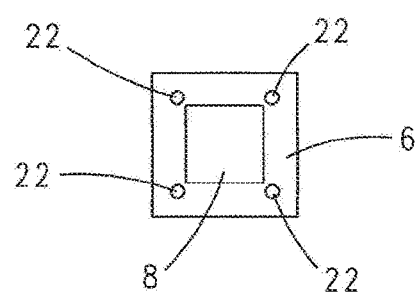
FIG. 3 is an isolated schematic plan view of a single combination frame and shadow mask including a first set of alignment features.

In an example, carrier 2 supports six combination frames and shadow mask 6/8 on a first (top) side of carrier 2 with each frame 6 supporting its corresponding shadow mask 8 in alignment with an aperture 4 of carrier 2 (FIG. 2). In an example, each shadow mask 8 can have the same pattern of apertures, or a different pattern of apertures. In another example, two or more (but less than all) of shadow masks 8 can have the same pattern of apertures while the remaining shadow mask(s) can have a different pattern of apertures. Each shadow mask 8 having the same or different pattern of apertures than the other shadow masks 8 is not to be construed in a limiting sense.

Initially, each combination frame and shadow mask 6/8 is positioned on carrier 2 in coarse, rough, or general alignment with the corresponding aperture 4 of carrier 2.

Figure 4:
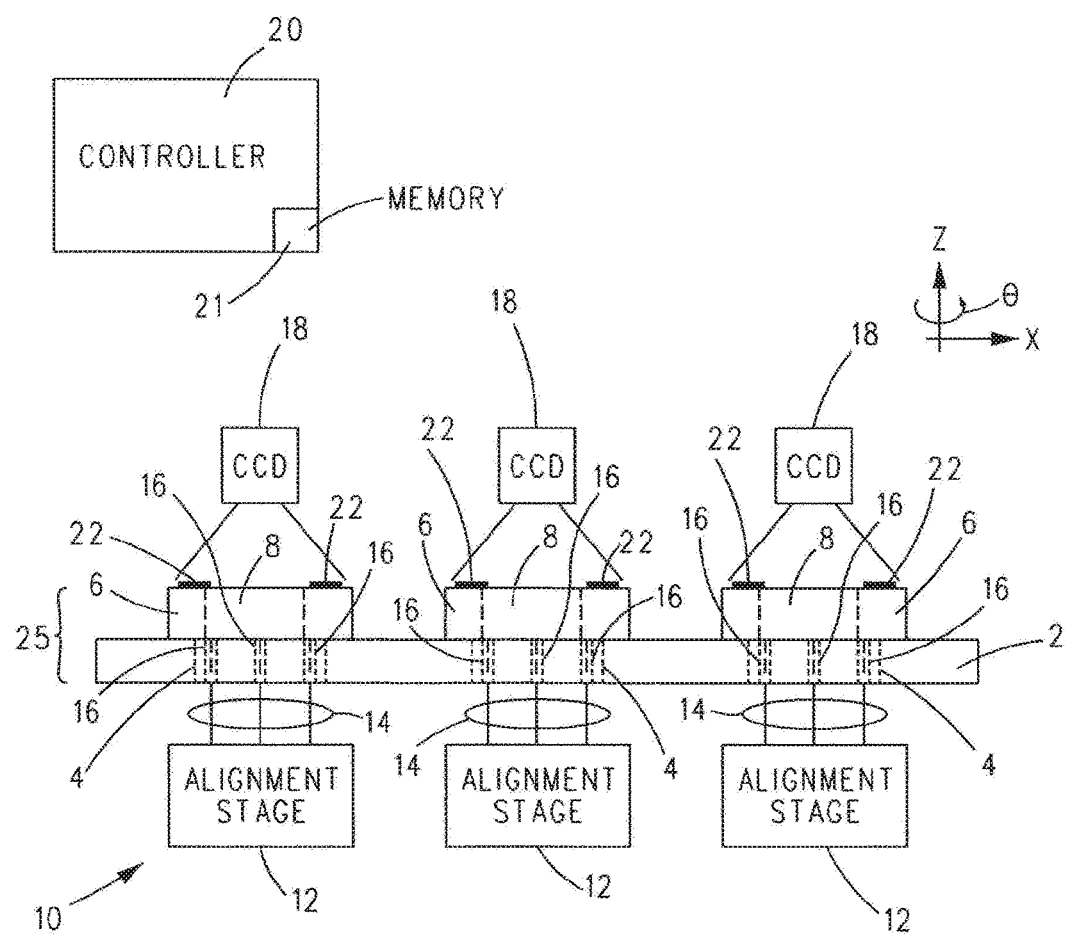
FIG. 4 is a schematic side view taken along lines IV-IV in FIG. 2 of the carrier frame including three combination frames and shadow masks in contact with the carrier frame, and further including a schematic of an alignment system including one or more alignment stages positioned below the carrier frame and three digital (CCD) cameras positioned above the three combination frames and shadow masks.
Figure 5:
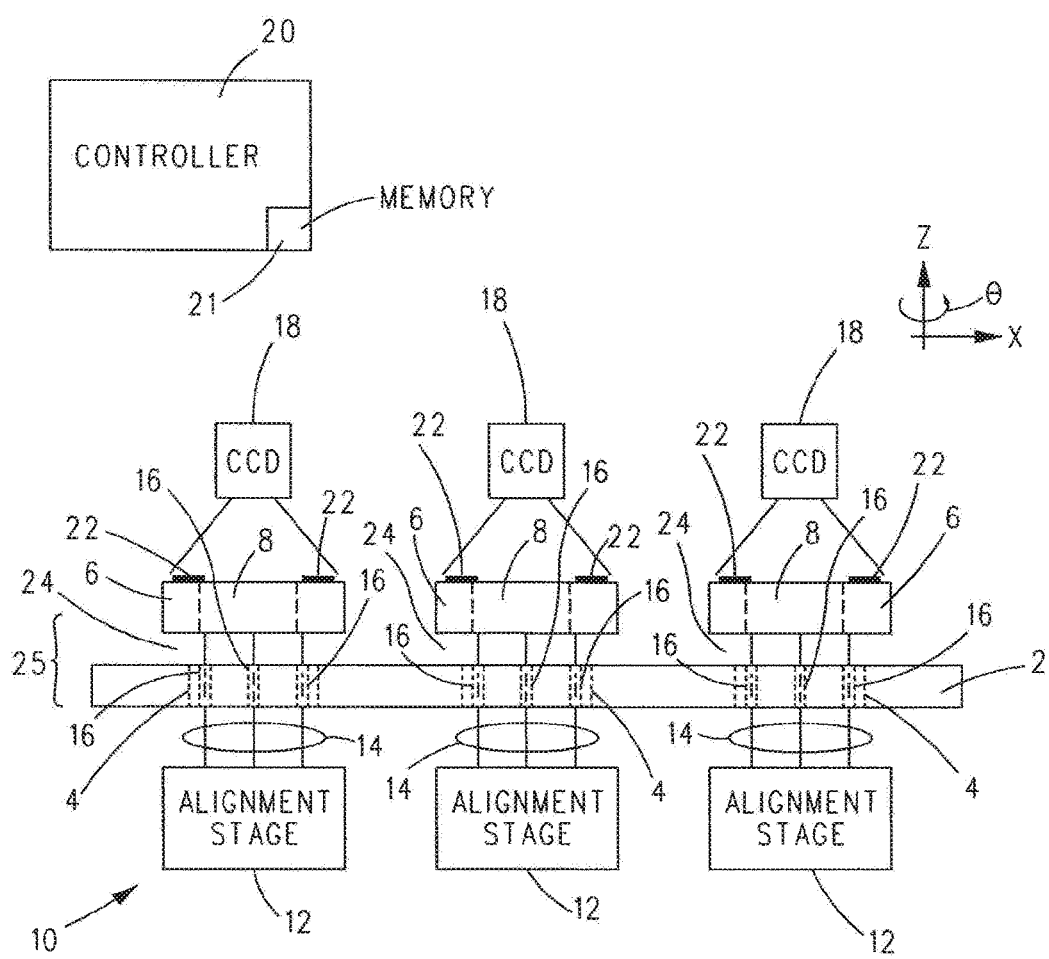
FIG. 5 is a view of the multi-mask alignment system shown in FIG. 4 with the three combination frames and shadow masks lifted above the top surface of the carrier frame via pins of the alignment stage(s) of the alignment system.

As shown in FIGS. 4 and 5, the first example multi-shadow mask alignment system includes an alignment system 10 positioned on a second (bottom) side of carrier 2 opposite the plural combination of frames and shadow masks 6/8. Alignment system 10 can include one or more alignment stages 12 as deemed suitable and/or desirable for fine positioning each combination frame and shadow mask 6/8 in the manner described hereinafter. In an example, each aperture 4 can include a dedicated alignment stage 12 for fine positioning the combination frame and shadow mask 6/8 positioned with its shadow mask 8 in alignment with said aperture 4. However, this is not to be construed as limiting since it is envisioned that each alignment stage 12 can be configured and operative to fine or precision align of any number combination frames and shadow masks 6/8. In an example, a single alignment stage 12 can be configured and operative for fine or precision aligning two or more combination frames and shadow masks 6/8 in the manner described hereinafter.

For the purpose of description, it will be assumed that there is a one-to-one correspondence between each combination frame and shadow mask 6/8 and a corresponding alignment stage 12. However, this is not to be construed in a limiting sense.

Each alignment stage 12 includes a number of elongated pins 14 that extend through holes 16 in carrier 2. In an example, three holes 16 (shown best in FIG. 1) surround each aperture 4. However, this is not to be construed in a limiting sense. Pins 14 extending through the holes 16 surrounding each aperture 4 contact the side of the frame 6 supporting the shadow mask 8 aligned with said aperture 4 facing carrier 2.

One or more digital (CCD) cameras 18 are positioned to a side of the plural combination frames and shadow masks 6/8 opposite carrier 2. In an example, each digital camera 18 is positioned to view a single combination frame and shadow mask 6/8. However, this is not to be construed in a limiting sense since it is envisioned that each digital camera 18 can be positioned and operative for viewing two, or more, or all of the combination frames and shadow masks 6/8. For the purpose of description, it will be assumed that there is a one-to-one correspondence between each combination frame and shadow mask 6/8 and digital camera 18. However, this is not to be construed in a limiting sense.

The multi-shadow mask alignment system also includes a programmed controller 20 coupled to each alignment stage 12 of alignment system 10 and each digital camera 18. The combination of controller 20 and digital cameras 18 define a control system of each example multi-mask alignment system described herein that includes digital cameras 18. Controller 20 is operative for controlling alignment system 10 and, more particularly, each alignment stage 12, to fine or precision align each combination frame and shadow mask 6/8 based on a position determined for a first set of alignment features 22 (shown best in FIG. 2) of the combination frame and shadow mask 6/8. In an example, frame 6 includes the first set of alignment features 22.

At a suitable time when it is desired to perform fine or precision alignment of a combination frame and shadow mask 6/8, controller 20 causes alignment stage 12 to extend pins 14 from the retracted position shown in FIG. 4 to the extended position shown in FIG. 5 whereupon the combination frame and shadow mask 6/8 is lifted from the first side of carrier 2 in the Z direction thereby defining a gap 24. The digital camera 18 positioned to the side of the combination frame and shadow mask 6/8 opposite carrier 2 acquires and forwards digital images, including the first set of alignment features 22, to controller 20 which is operative for processing the digital images and, based on the processed digital images, to control alignment stage 12 to fine or precision adjust the position of the combination frame and shadow mask 6/8.

More specifically, controller 20 is operative for processing the digital images, including the first set of alignment features 22, and, based on the processed digital images, to control alignment stage 12 to adjust the position of the combination frame and shadow mask 6/8 in the X, Y and/or θ directions such that the first set of alignment features are fine or precision aligned to a predetermined set of coordinates stored in a memory 21 of controller 20. This predetermined set of coordinates can be stored in memory 21 in any suitable or desirable format, including, for example, a drawing or CAD file. However, this is not to be construed in a limiting sense since it is envisioned that any suitable and/or desirable manner of storing the predetermined set of coordinates that controller 20 utilizes to align with the first set of alignment features 22 can be utilized.

In an example, controller 20 is programmed to identify the first set of alignment features 22 and their locations in an image acquired from digital camera 18 of the combination frame and shadow mask 6/8. Upon identifying the first set of alignment features 22 and their locations, controller causes alignment stage 12 to fine or precision align the first set of alignment features 22 to the predetermined coordinates stored in a file in memory 21 of controller 20. The alignment features 22 can be points, lines, contours, circles, rings, and/or any other suitable and/or desirable feature. The alignment of the first set alignment features 22 can be based on intensity of the first set of alignment features 22 or based on image features. In an example, controller can compare the first set of alignment features 22 in an acquired image to a predetermined set of alignment features at a predetermined set of coordinates stored in a digital reference or source image stored in memory 21 of controller 20. Absent alignment between the first set alignment features 22 and the predetermined set of alignment features of the reference or source image stored in memory 21, controller 20 can cause alignment stage 12 to move in the X, Y and/or θ directions as necessary in order to align the predetermined set of alignment features in the reference or source image to the first set of alignment features 22 in an image acquired of the combination frame and shadow mask 6/8 by digital camera 18. The particular manner in which the first set of alignment features 22 is compared to a predetermined set of coordinates stored in memory 21 of controller 20 is not to be construed as limiting since it is envisioned that such comparison can occur in any suitable and/or desirable manner now known or hereinafter developed.

More specifically, in order to perform fine or precision alignment of the first set of alignment features 22 to the predetermined set of coordinates stored in memory 21 after gap 24 is formed, controller 20 causes alignment stage 12 to move the combination frame and shadow mask 6/8, as necessary, in the X, Y and/or θ direction (clockwise or counterclockwise) around the Z direction. Once controller 20 has determined that the first set of alignment features 22 are fine or precision aligned to the predetermined set of coordinates stored in memory 21, controller causes alignment stage 12 to lower pins 14 thereby returning combination frame and shadow mask 6/8 from the position shown in FIG. 5 back to the position shown in FIG. 4, with frame 6 in contact to the first side of carrier 2. Thereafter, each combination frame and shadow mask 6/8 can be secured to carrier 2 in any suitable and/or desirable manner, such as, for example, adhesive or welding frame 6 to carrier 2, to form a finished assembly 25 comprising carrier 2 having a plurality of combination frames and shadow masks 6/8 secured thereto with each shadow mask 8 fine or precision aligned to each other combination frame and shadow mask 6/8 secured to carrier 2. In an example, the first set of alignment features and the predetermined set of alignment features can be complementary. However, this is not to be construed in a limiting sense.

Figure 8:
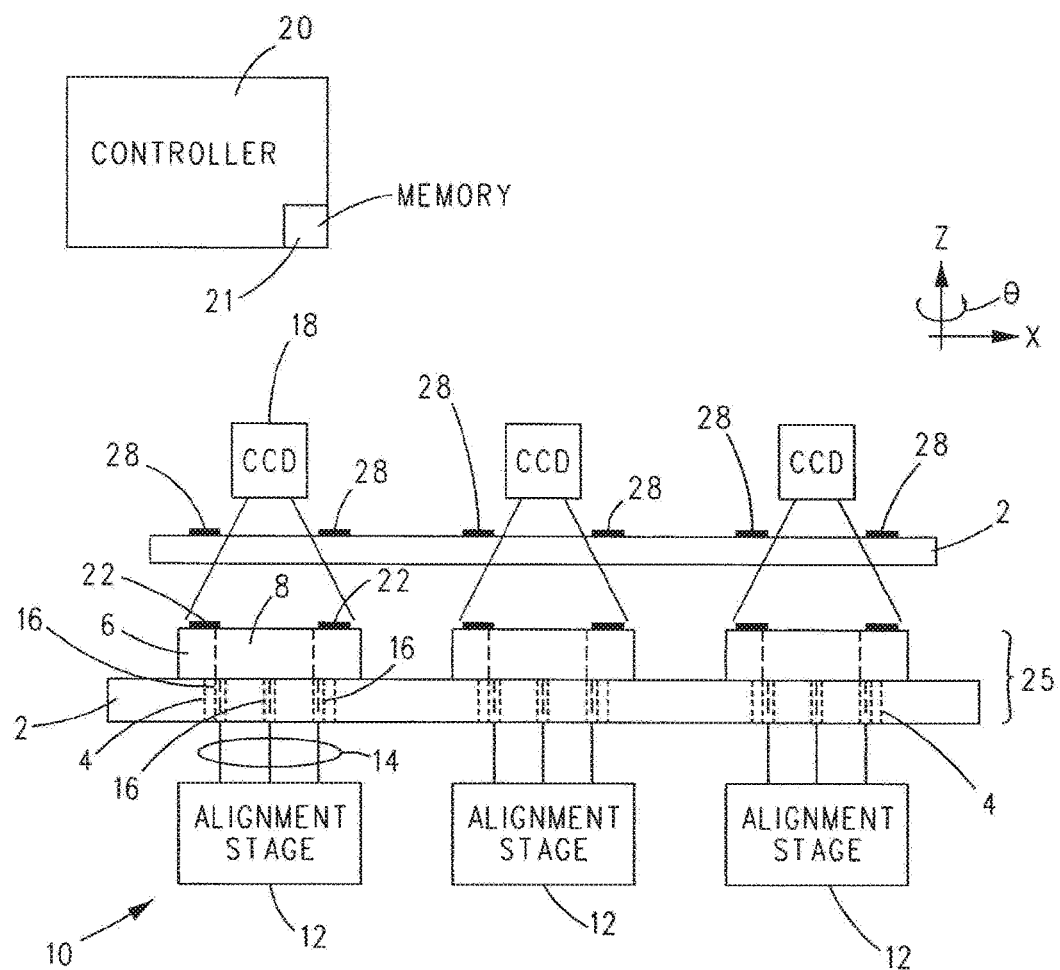
FIG. 8 is a schematic side view of the multi-mask alignment system shown in FIG. 4 including the alignment substrate of FIG. 7 positioned between the three digital cameras and the three combination frames and shadow masks.
Figure 9:
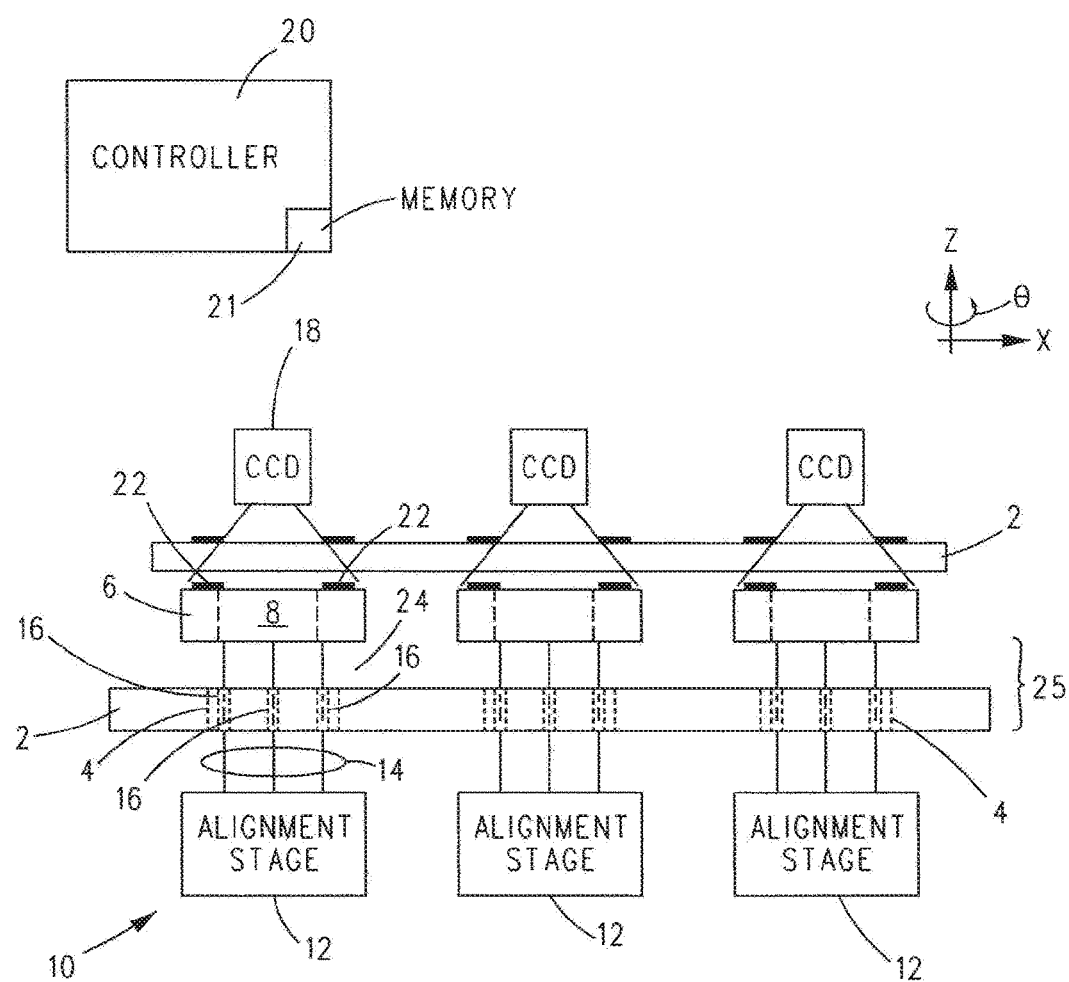
FIG. 9 is a view of the multi-mask alignment system shown in FIG. 8 with the three combination frames and shadow masks lifted above the top surface of the carrier frame via pins of the alignment stage(s) of the alignment system.
Figure 10:
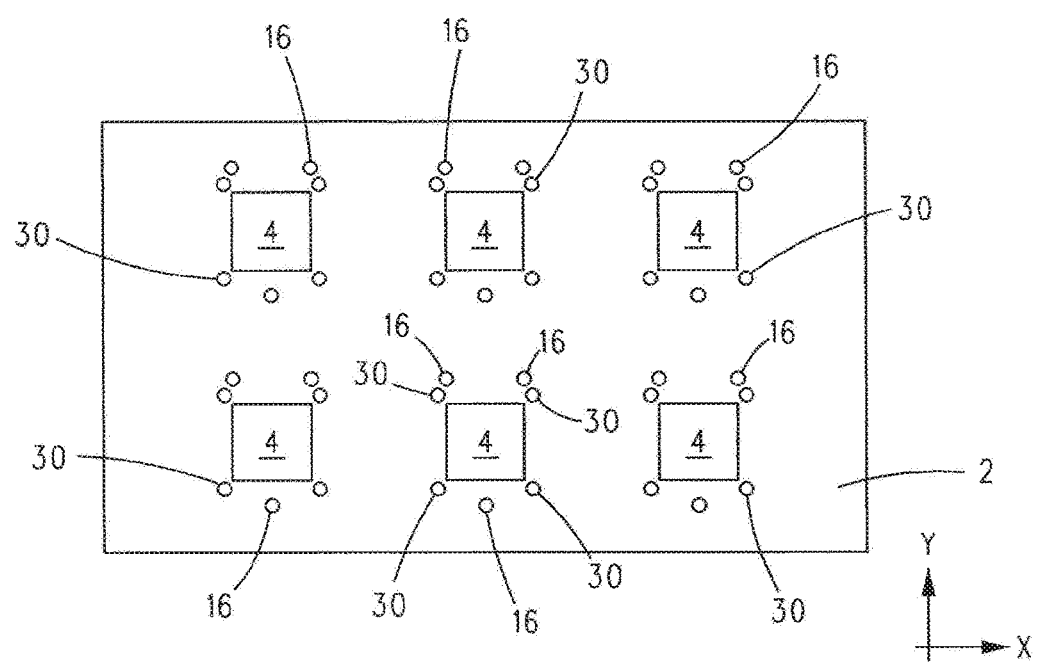
FIG. 10 is a plan view of another example carrier frame including a second set of alignment features (different than the second set of alignment features shown on the alignment substrate in FIG. 7)
Figure 11:
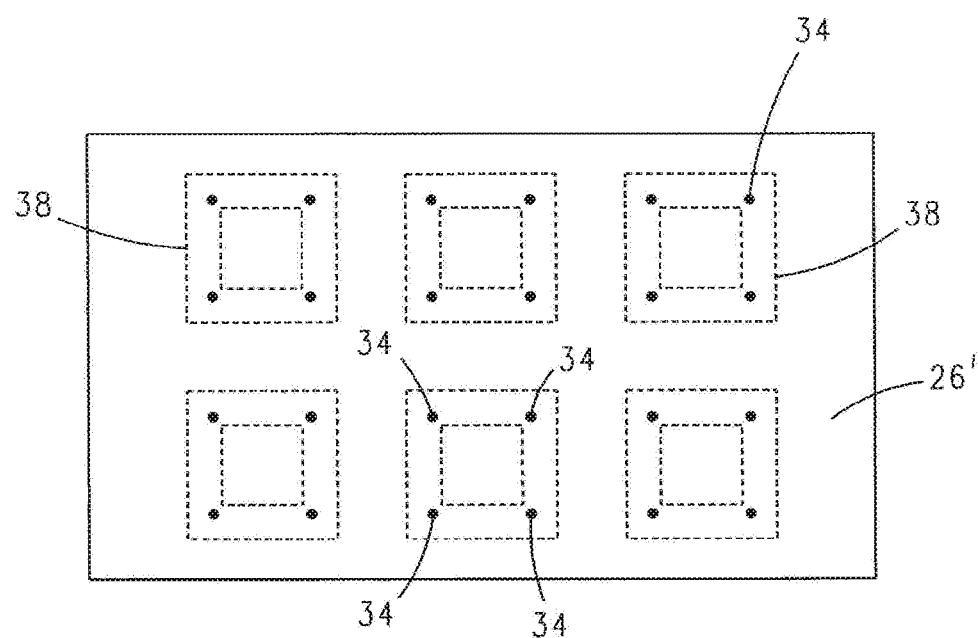
FIG. 11 is a plan view of an alignment substrate including a number of light receivers and optional support frames (shown in phantom) for supporting the light receivers on the alignment substrate.
Figure 12:
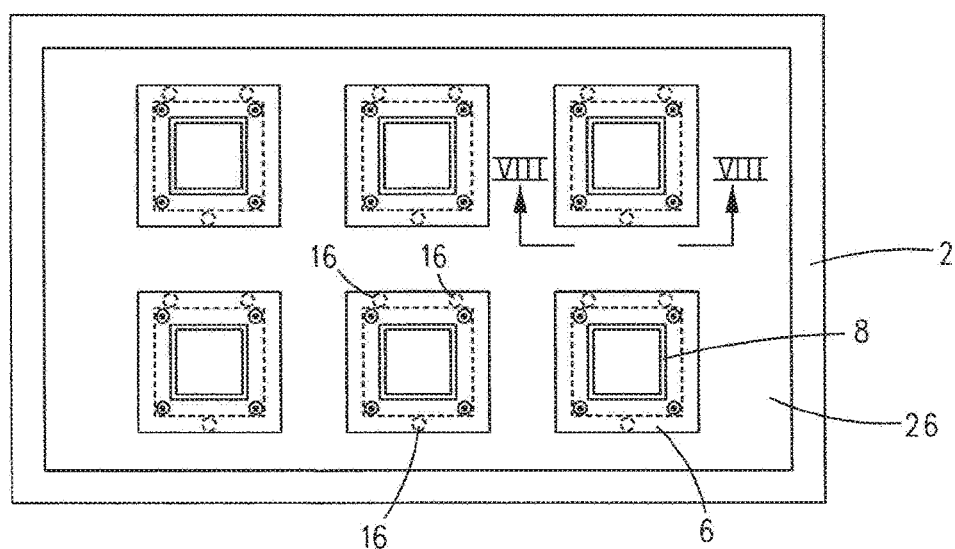
FIG. 12 is a plan view of the alignment substrate of FIG. 11 positioned over a plurality of combination frames and shadow masks disposed on the carrier frame shown in FIG. 10.

With reference to FIGS. 6-9 and with continuing reference to FIGS. 1-5, in a second example multi-mask alignment system, similar in many respects to the first example multi-mask alignment system of FIGS. 1-5, an alignment substrate 26 (FIG. 7) is positioned between digital cameras 18 and the plurality of combination frames and shadow masks 6/8 (FIGS. 8 and 9). In an example, alignment substrate 26 is transparent and is made of a material that has good dimensional stability, such as, for example, glass. Alignment substrate 26 includes a second set of alignment features 28 (shown best in FIG. 7) in a pattern corresponding to the pattern of the first set of alignment features 22 (shown, e.g., in FIG. 6) of the plural combination frames and shadow masks 6/8 positioned in coarse alignment on carrier 2.

In this example, each digital camera 18 is operative for acquiring and forwarding digital images, including the first and second sets of alignment features 22 and 28, to controller 20 which is operative for processing the digital images and, based on the processed digital images, to cause alignment system 10 to adjust the position of each combination frame and shadow mask 6/8 to fine or precision align the first and second set of alignment features 22 and 28.

For the purpose of description, it will be assumed that a single alignment stage 12 of alignment system 10 and a single digital camera 18 are utilized for fine or precision alignment of a single combination frame and shadow mask 6/8. However, this is not to be construed in a limiting sense.

At a suitable time, controller 20 causes alignment stage 12 to extend pins 14 from the retracted position shown in FIG. 8 to the extended position shown in FIG. 9 defining gap 24 between the first side of carrier 2 and the side of the combination frame and shadow mask 6/8 facing carrier 2.

Digital camera 18 positioned to the side of the combination frame and shadow mask 6/8 opposite carrier 2 acquires and forwards digital images, including the first and second sets of alignment features 22 and 28, to controller 20. Controller 20 is operative for processing the digital images and, based on the processed digital images, to cause alignment stage 12 to move in the X, Y and/or θ directions as necessary in order to fine or precision align the first and second sets of alignment features 22 and 28.

In this example, each frame 6 includes four alignment features 22 (FIG. 6) and alignment substrate 26 includes four alignment features 28 (FIG. 6) configured to be aligned with the four alignment features 22 of said frame 6. The number of first and second sets of alignment features 22 and 28 used for aligning each combination frame and shadow mask 6/8 is not to be construed in a limiting sense.

Figure 6:
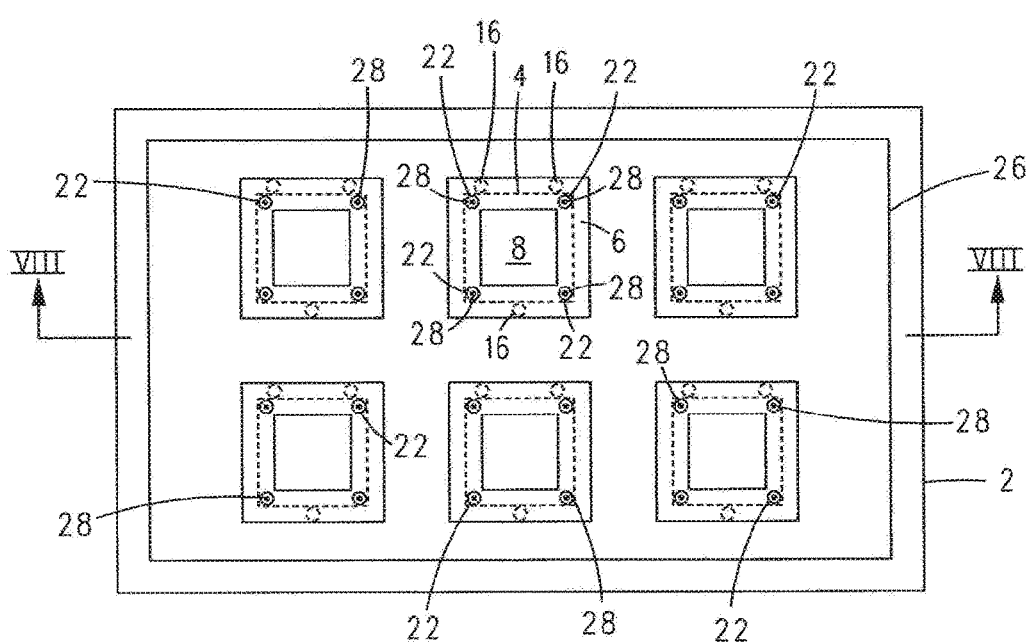
FIG. 6 is a schematic plan view of an alignment substrate positioned over the plural combination frames and shadow masks positioned on a carrier frame shown in FIG. 2.
Figure 7:
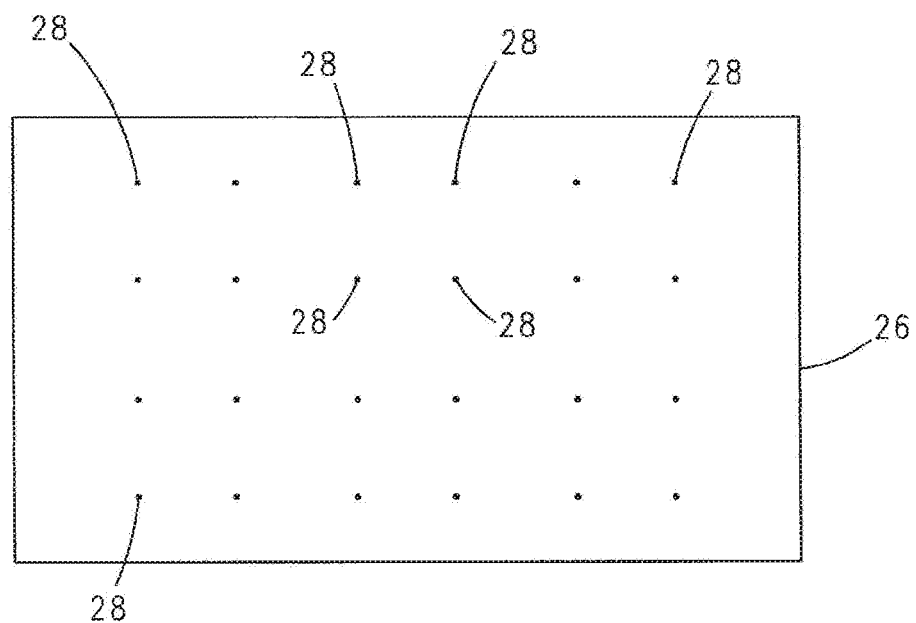
FIG. 7 is an isolated schematic plan view of the alignment substrate of FIG. 6 including a second set of alignment features.

In an example, the alignment features on frame 6 can be complementary with the corresponding alignment features 28 of alignment substrate 26. For example, each alignment feature 22 can be one of a ring (as shown in FIG. 6) or a filled-in circle and each alignment feature 28 can be the other of a filled-in circle (also as shown in FIG. 6) or a ring. Different styles or shapes of alignment features 22 and 28, complementary or not, are envisioned.

Once controller 20 has determined that the first and second sets of alignment features 22 and 28 are aligned, controller causes alignment stage 12 to lower pins 14 thereby returning the combination frame and shadow mask 6/8 from the position shown in FIG. 9 back to the position shown in FIG. 8 with the frame 6 in contact with the first side of carrier 2. Thereafter, each combination frame and shadow mask 6/8 is secured to carrier 2 in any suitable and/or desirable manner, such as, for example, by adhesive or welding, to form finished assembly 25.

With reference to FIGS. 10-14 and with continuing reference to all previous figures, in a third example multi-mask alignment system, alignment substrate 26 includes light receivers 34 (in place of the second set of alignment features 28 on the alignment substrate 26 of the second example multi-mask alignment system) and carrier 2 is provided with a second set of alignment features 30. It is to be appreciated that alignment features 28 of alignment substrate 26 (in the second example multi-mask alignment system) and alignment features 30 of carrier 2 (in this third example multi-mask alignment system) are each used independently with the first set of alignment features 22 of the combination frame and shadow mask 6/8. Optional support frames 38 (shown in phantom) can be included on carrier 2 for supporting light receivers 34 to avoid sagging of carrier 2 due to the added weight of light receivers 34.

In an example, either one or both of the first and second sets of alignment features 22 and 30 can be holes. If desired, the holes of the first and/or second sets of alignment features 22 and 30 can be filled with a light transmissive material.

Light sources 32 (FIGS. 13 and 14) can be positioned on the second (bottom) side of carrier 2 opposite the combination frame and shadow mask 6/8. In an example, each light receiver 34 (e.g., a photodiode) disposed on alignment substrate 26 is configured to be aligned with the light output from one of the light sources 32 (e.g., an LED) thereby defining a light source—light receiver pair 32/34. Each light source—light receiver pair 32/34 defines therebetween a light path 36. In an example, one alignment feature 22 of the first set of alignment features 22 and one alignment feature 30 of the second set of alignment features 30 are positioned along each light path 36.

In this example, controller 20 is operative for processing the outputs of light receivers 34 and, based on the processed outputs of light receivers 34, for causing the alignment stage 12 to adjust a position of the combination frame and shadow mask 6/8 to fine or precision align the one alignment feature 22 of the first set of alignment features and the one alignment feature 30 of the second set of alignment features in each light path 36. In this example, controller 20 and light receivers 34 define a control system.

For the purpose of this description, it will be assumed that a single alignment stage 12 of alignment system 10 and a plurality of light source—light receiver pairs 32/34 defining light pairs 36 are utilized for fine or precision alignment of a single combination frame and shadow mask 6/8. In a particular example, four light source—light receiver pairs 32/34 defining four light paths 36 are utilized for fine or precision alignment of a single combination frame and shadow mask 6/8. However, this is not to be construed in a limiting sense.

Figure 13:
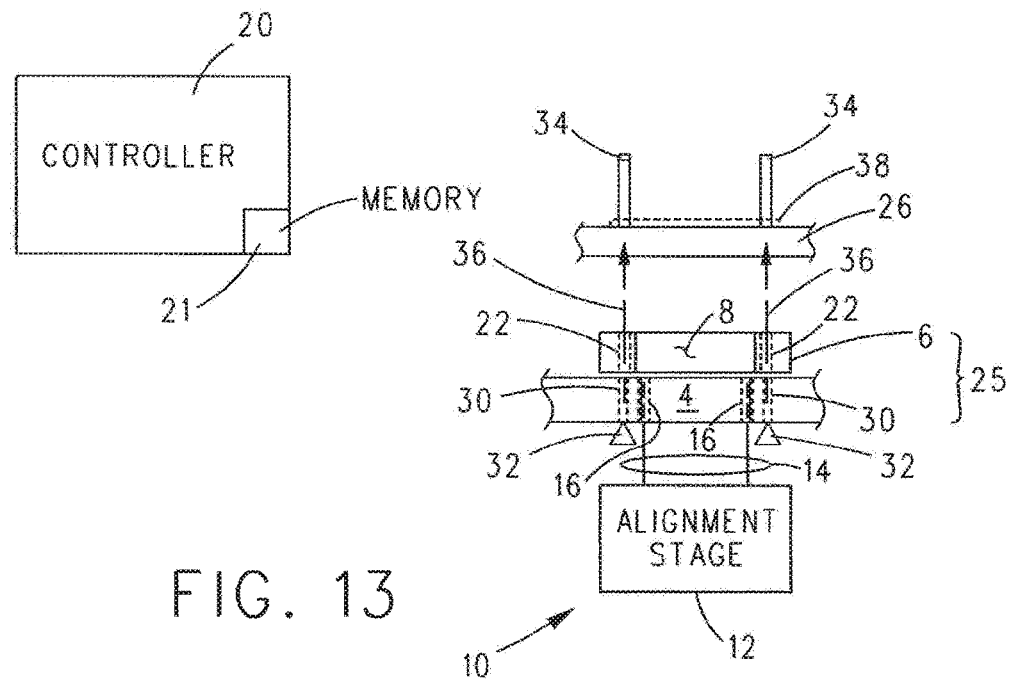
FIG. 13 is a view taken along lines XIII-XIII in FIG. 12 of the alignment substrate including light receivers positioned over a combination frame and shadow mask disposed on a top surface of the carrier frame shown in FIG. 10 and light sources positioned under the carrier frame.
Figure 14:
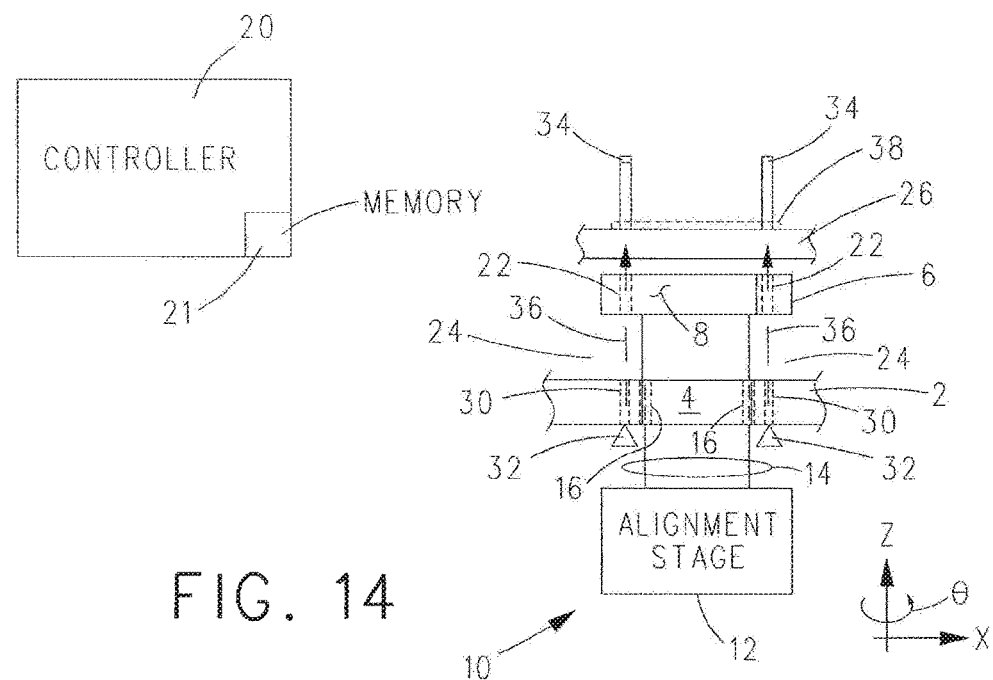
FIG. 14 is a view of the multi-mask alignment system shown in FIG. 13 with the combination frame and shadow mask lifted above the top surface of the carrier frame via the pins of alignment stage of the alignment system.

At a suitable time, controller 20 causes alignment stage 12 to extend pins 14 from the retracted position shown in FIG. 13 to the extended position shown in FIG. 14 thereby forming gap 24. Then, with light sources 32 on, controller causes alignment stage 12 to move the combination frame and shadow mask 6/8 in the X, Y and/or θ directions as necessary to fine or precision align the first set of alignment features 22 to the corresponding second set of alignment features 30 (wherein one alignment feature 22 of the first set of alignment features and one alignment feature 30 of the second set of alignment features lie along each light path 36 as shown) until a predetermining amount of light is received by the light receivers 34 used for aligning said combination frame and shadow mask 6/8.

Once controller 20 has determined, via the outputs of light receivers 34, that the fine or precision alignment of the combination frame and shadow mask 6/8 is complete, controller 20 causes alignment stage 12 to return the combination frame and shadow mask 6/8 from the position shown in FIG. 14 back to the position shown in FIG. 13, with frame 6 in contact with the first side of carrier 2. Thereafter, each combination frame and shadow mask 6/8 is secured to carrier 2 in any suitable or desirable manner, such as, for example, adhesive or welding frame 6 to carrier 2, to form finished assembly 25.

Figure 15:
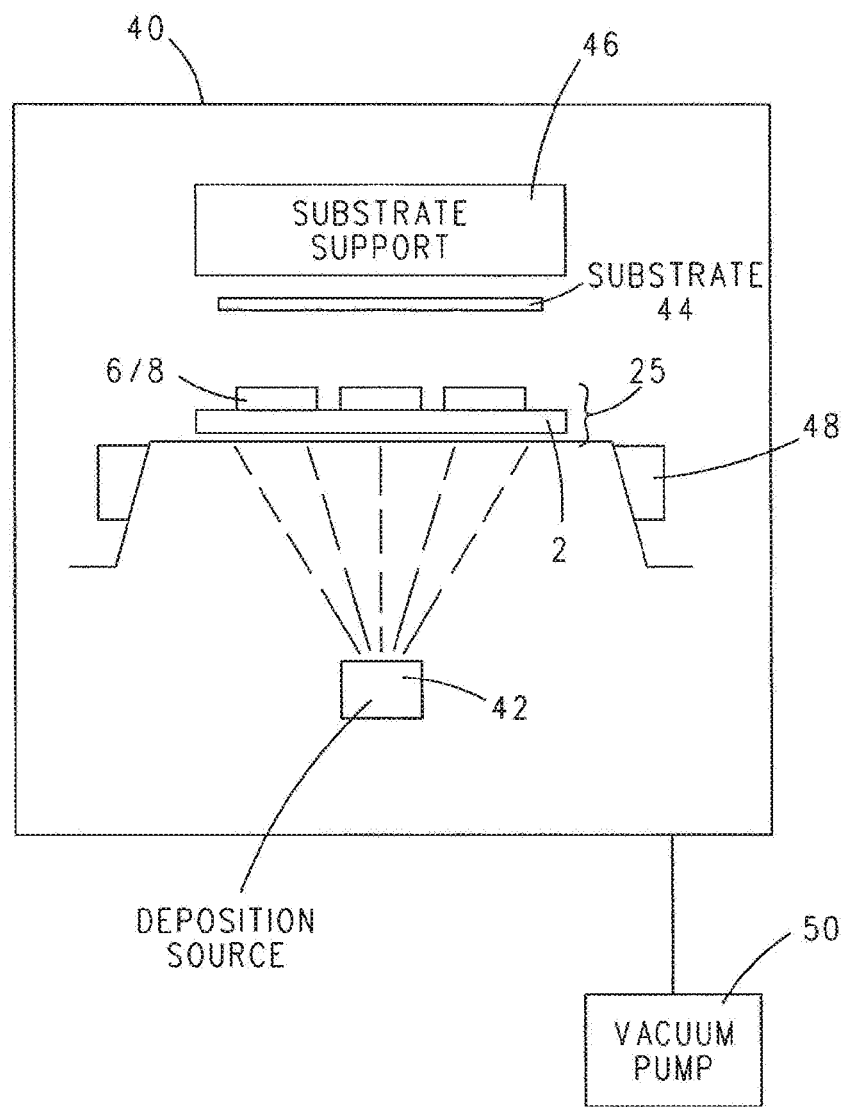
FIG. 15 is a schematic view of a shadow mask vapor deposition chamber including a finished assembly that includes plural combination frames and shadow masks fine or precision aligned on the carrier frame in one of the manners disclosed herein.
Figure 16:
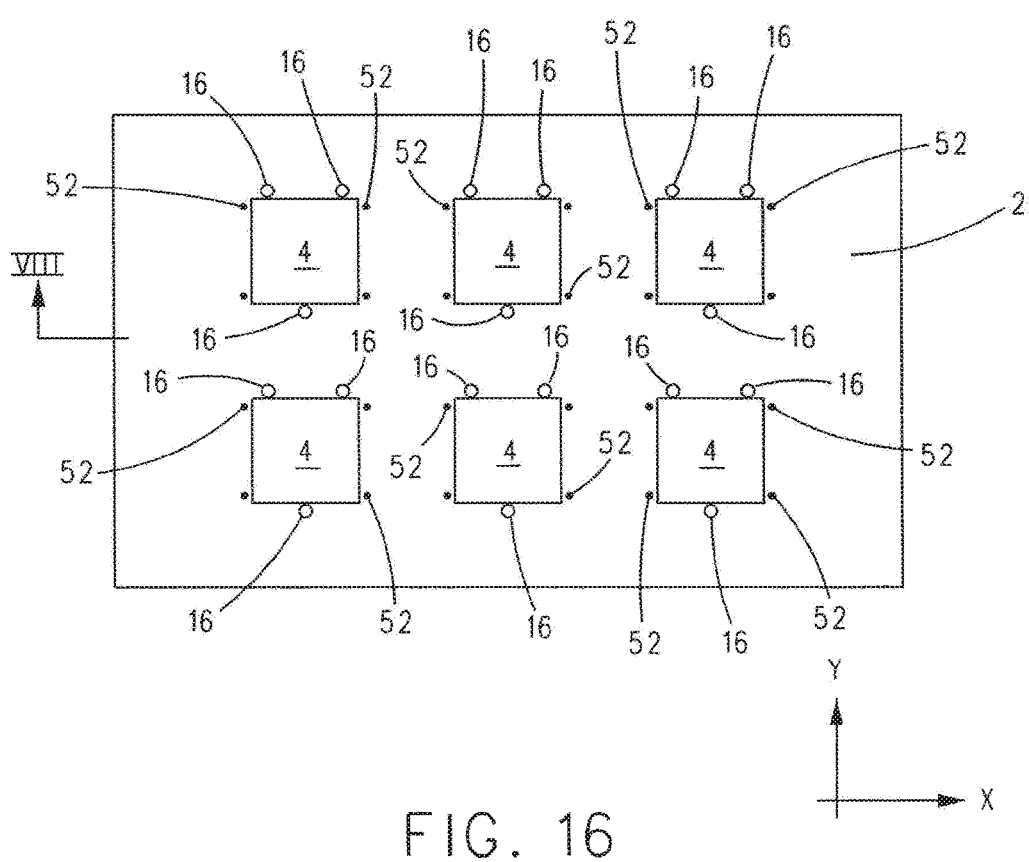
FIG. 16 is a schematic plan view of the carrier frame of FIG. 1 including leveling pins around each aperture of the carrier frame.
Figure 17:
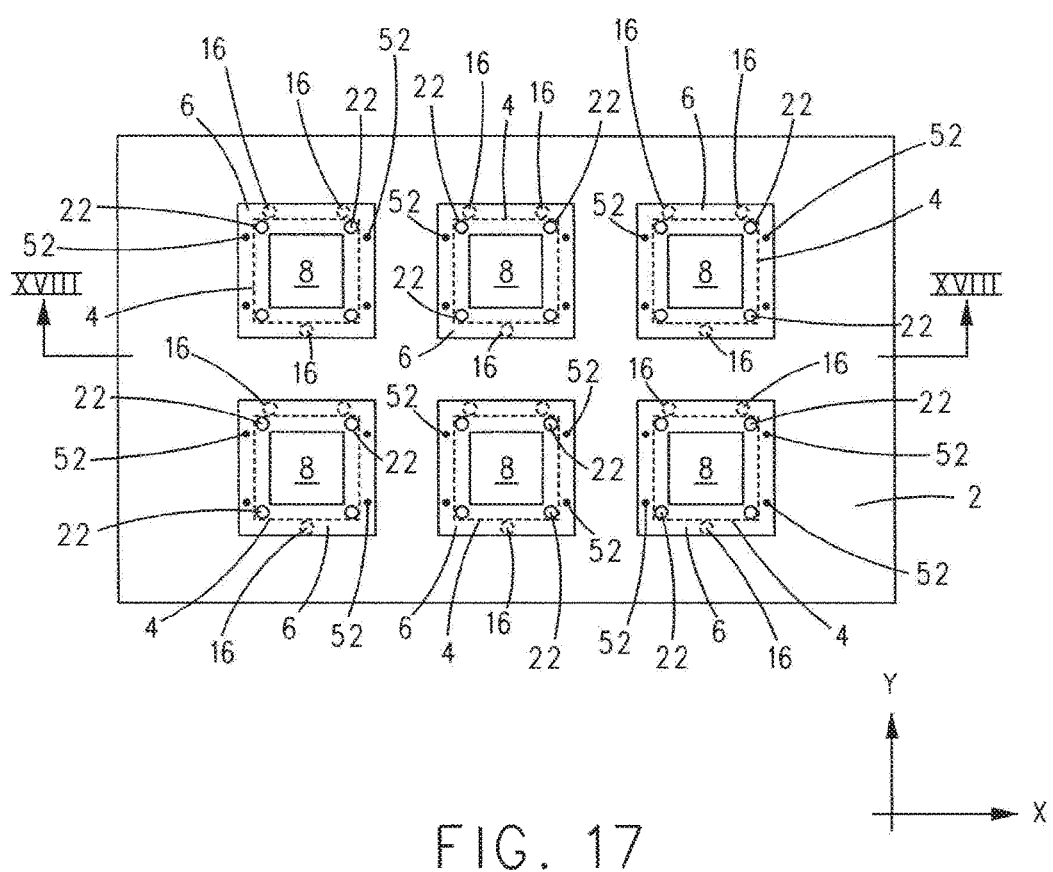
FIG. 17 is a schematic plan view of the plural combination frames and shadow masks positioned on the carrier frame shown in FIG. 16, with each shadow mask positioned in alignment with an aperture in the carrier frame, and with each shadow mask supported by the leveling pins around the corresponding aperture in the carrier frame.

With reference to FIG. 15, once finished assembly 25 has been prepared in any of the manners described in the foregoing examples, finished assembly 25 can be placed inside of a deposition vacuum vessel 40 between a deposition source 42 and a substrate 44 which is supported by a substrate support 46. Deposition vacuum vessel 40 can also include an alignment system 48 which can be utilized to align finished assembly 25 and, hence, the shadow masks 8 thereof, to substrate 44. A vacuum pump 50 can be used to evacuate deposition vacuum vessel 40 to a suitable pressure for performing a vapor deposition event therein.

Deposition source 42 is charged with a desired material to be deposited onto substrate 44 via the one or more openings in each shadow mask 8 which is held in intimate contact with a portion of substrate 44 during a deposition event. The one or more openings of each shadow mask 8 correspond to a desired pattern of material to be deposited on substrate 44 from deposition source 42.

The illustration and discussion of finished assembly 25 inside of deposition vacuum vessel 40 is for the purpose showing but one example of the use of finished assembly 25 to perform vapor deposition events through the shadow masks 8 thereof. However, this is not to be construed in a limiting sense.

With reference to FIGS. 16-20, and with continuing reference to all previous figures, in an example, as an option to carrier 2 supporting each combination frame and shadow mask 6/8 in direct contact with the first (top) side of carrier 2 in alignment with an aperture 4 of carrier 2, as shown in FIGS. 4 and 8, carrier 2 can include a number of leveling pins or spacers 52 surrounding each aperture 4.

Figure 18:
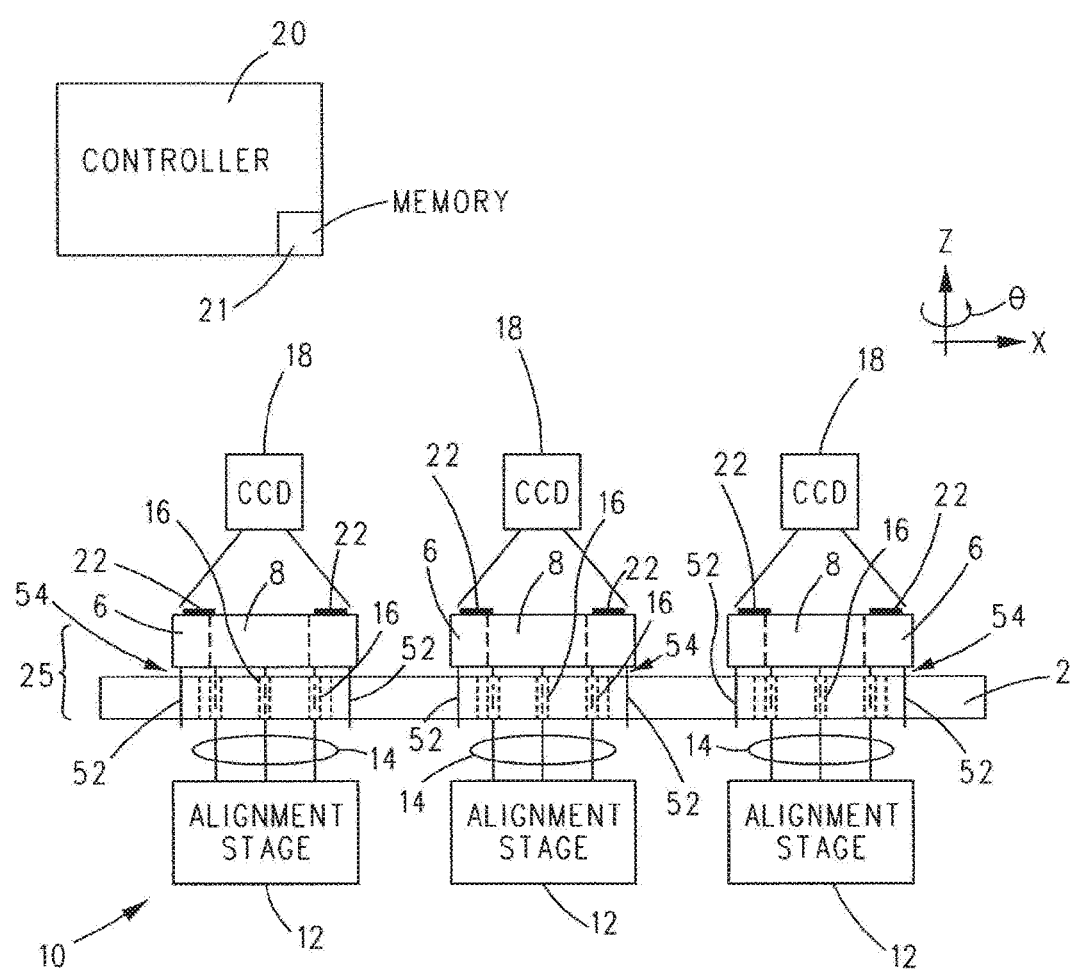
FIG. 18 is a schematic side view (similar to the schematic side view show in FIG. 4) taken along lines XVIII-XVIII in FIG. 17 of the carrier frame including three combination frames and shadow masks in contact with the leveling pins projected through the carrier frame, and further including a schematic of an alignment system including one or more alignment stages position below the carrier frame and three digital (CCD) cameras positioned above the three combination frames and shadow masks.

The set of leveling pins 52 surrounding each aperture 4 can support the corresponding frame 6 (and hence, shadow mask 8) in spaced relation to the first (top) side of carrier 2 forming a gap 54 (FIG. 18) therebetween when pins 14 of alignment stages 12 are in the retracted positions shown in FIG. 18.

Figure 19:
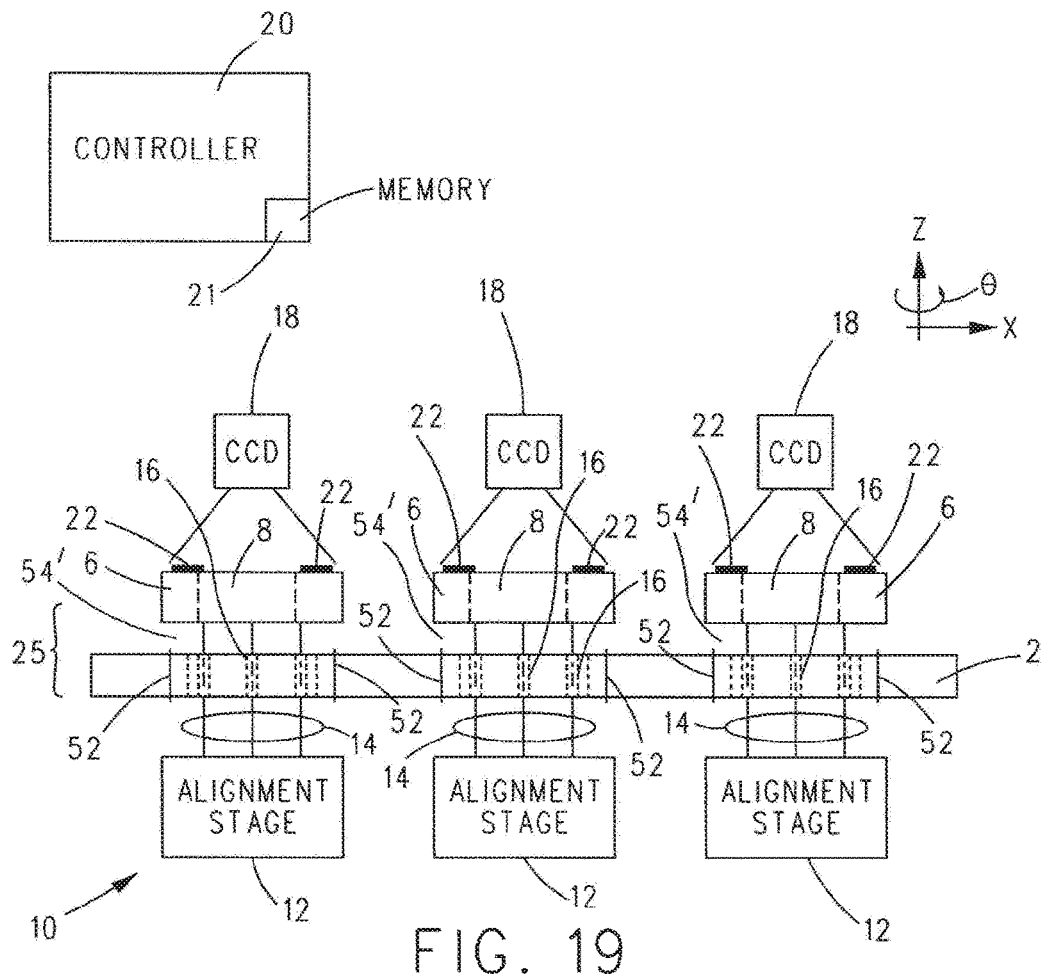
FIG. 19 is a schematic side view (similar to the view shown in FIG. 5) of the multi-mask alignment system shown in FIG. 18 with the three combination frames and shadow masks lifted above the top surfaces of the leveling pins by pins of the alignment stages of the alignment system.

At a suitable time when it is desired to perform fine, precision alignment of a combination frame and shadow mask 6/8, controller 20 causes alignment stage 12 to extend pins 14 from the retracted position shown in FIG. 18 to the extended position shown in FIG. 19 whereupon the combination frame and shadow mask 6/8 is lifted from the top sides of pins 52 in the Z direction thereby increasing the size of the gap from the size shown by reference numbers 54 in FIG. 18 to the size shown by reference numbers 54' in FIG. 19. Once the combination frame and shadow mask 6/8 has been fine, precision aligned in the manner discussed above, controller 20 causes alignment stage 12 to lower pins 14 thereby returning the combination frame and shadow mask 6/8 from the position shown in FIG. 19 back to the position shown in FIG. 18, with the bottom of frame 6 in contact with the top ends of leveling pins 52 with gap 54 between the combination frame and shadow mask 6/8 and the top surface of carrier frame 2.

While the use of carrier frame with leveling pins 52 projected therethrough is being described herein in connection with the first example multi-mask alignment system of FIGS. 1-5, it is to be understood that the carrier 2 including leveling pins 52 projected therethrough can also be utilized with the second example multi-mask alignment system shown in FIGS. 6-9 and/or the third example multi-mask alignment system shown in FIGS. 10-14. Accordingly, the description herein of the use of carrier 2 including leveling pins 52 projected therethrough in connection with the first example multi-mask alignment system as shown in FIGS. 1-5 is not to be construed in a limiting sense.

Figure 20:
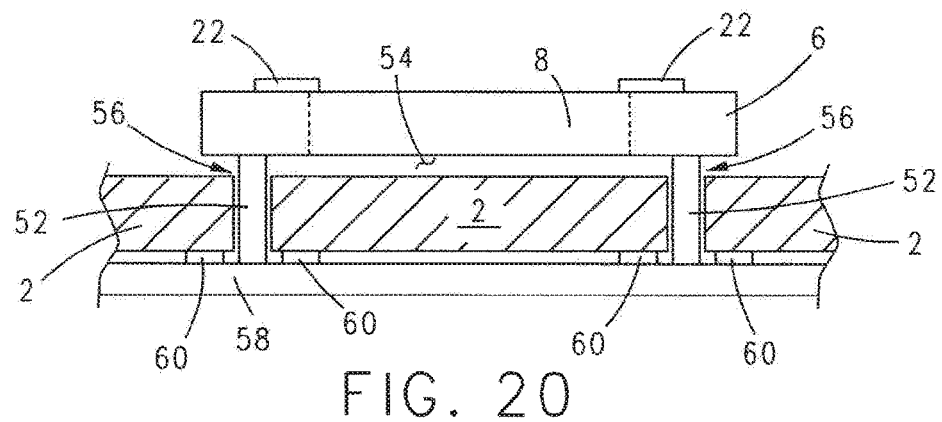
FIG. 20 shows a pair of leveling pins protected through and supported by the carrier frame (shown in cross-section) with a lower or first end of each leveling pin in contact with a reference surface and with an upper, second end of each leveling pin in contact with a single instance of a combination frame and shadow mask, wherein the lower ends of the leveling pins support the lower surface of the carrier frame in spaced, gapped relationship to a top of the reference surface, and the upper ends of the leveling pins support a bottom surface of the combination frame and shadow mask in spaced, gapped relationship to a top surface of the carrier frame.

Referring to FIG. 20, there is shown an isolated cross section of carrier 2 including a pair of leveling pins 52 projected through openings 56 in carrier 2. The leveling pins 52 projected through openings 56 of carrier 2 are precision formed to be, in an example, the same length±a predetermined tolerance. In an example, this±predetermined tolerance can be <±0.5 mm; can be <±0.05 mm; or can be <±0.01 mm, whereupon the maximum difference in length between any pair of alignment pins 52 is this tolerance.

Leveling pins 52 projected through carrier frame 2 aid in planarizing each combination frame and shadow mask 6/8 and aid in planarizing all of the combination frames and shadow masks 6/8 supported by carrier 2 with respect to each other.

The process by which leveling pins 52 are projected through and secured in openings 56 of carrier 2 will now be described with reference to FIG. 20.

Initially, the bottom side of carrier 2 is positioned in spaced relation to a reference, flat surface 58 via a set of shims 60 that, like leveling pins 52, are precision formed so that a distance between a top surface and a bottom surface of each shim 60 is within ±a predetermined tolerance. In an example, this±tolerance can be <±0.5 mm; can be <±0.05 mm; or can be <±0.01 mm.

At a suitable time, a leveling pin 52 is projected or inserted into each opening 56 of carrier 2 (which opening 56 is pre-formed in carrier 2) until the first, bottom, or lower end of the leveling pin 52 contacts the top side of reference surface 58. Next, said leveling pin 52 is bonded to carrier 2 in any suitable and/or desirable manner, such as, for example, without limitation, gluing, braising, laser welding, or some combination thereof. Also or alternatively, it is envisioned that the size of each leveling pin 52 and the size of each opening 56 can be configured such that said leveling pin 52 press fits into said opening 56. The particular manner in which each leveling pin 52 is secured within an opening 56 is not to be construed in a limiting sense.

Thereafter, carrier frame 2 including leveling pins 52 secured in openings 56 thereof can be utilized as discussed above as an aid to planarizing each combination frame and shadow mask 6/8, wherein the bottom surface of each frame 6 is supported by the second, top ends of the leveling pins 52 in the manner shown in FIG. 20. Similarly, carrier 2 including leveling pins 52 projected through openings 56 thereof can be utilized for planarizing any number of combination frames and shadow masks 6/8 with respect to each other. Hence, in summary, in addition to aiding in planarizing each combination frame and shadow mask 6/8, carrier frame including a set of leveling pins 52 around each aperture 4 can also be utilized as an aid for planarizing a number of combination frames and shadow masks 6/8 being supported by the leveling pins 52 of carrier 2 with respect to each other.

The embodiments have been described with reference to various examples. Modifications and alterations will occur to others upon reading and understanding the foregoing examples. Accordingly, the foregoing examples are not to be construed as limiting the disclosure.

The invention claimed is:

1. A multi-mask alignment system comprising:
a carrier including first and second sides and a plurality of apertures extending through the carrier from the first side to the second side, wherein each aperture has associated therewith a combination frame and shadow mask including alignment features, wherein the shadow mask is supported via the frame on the first side of the carrier with the shadow mask in alignment with the aperture;
an alignment system positioned on the second side of the carrier;
a controller operative for controlling the alignment system to individually align each combination frame and shadow mask such that the alignment features of said combination align with reference alignment features associated with said combination but not part of the carrier or said combination; and
spacers positioned on the carrier and configured to support each combination frame and shadow mask above a surface of the first side of the carrier; and
at least one camera operative for acquiring images that include the alignment features, wherein the controller is operative for controlling the alignment system based on the acquired images, wherein:
the reference alignment features comprise reference coordinates stored in a memory; and
the controller controls the alignment system to align the alignment features in the acquired images to the reference coordinates.

2. The system of claim 1, wherein the spacers are configured to planarize each combination frame and shadow mask.

3. The system of claim 1, wherein the spacers are configured to planarize all of the combination frames and shadow masks with respect to each other.

4. The system of claim 1, wherein:
the spacers comprise leveling pins projected through openings in the carrier; and
the leveling pins are secured in the openings in the carrier.

5. The system of claim 4, wherein the leveling pins are secured in the openings in the carrier via bonding or press fit.

6. The system of claim 1, wherein the controller is operative for controlling the alignment system to simultaneously align each combination frame and shadow mask.

7. A multi-mask alignment system comprising:
a carrier including first and second sides and a plurality of apertures extending through the carrier from the first side to the second side, wherein each aperture has associated therewith a combination frame and shadow mask including alignment features, wherein the shadow mask is supported via the frame on the first side of the carrier with the shadow mask in alignment with the aperture;

an alignment system positioned on the second side of the carrier;

a controller operative for controlling the alignment system to individually align each combination frame and shadow mask such that the alignment features of said combination align with reference alignment features associated with said combination but not part of the carrier or said combination;

spacers positioned on the carrier and configured to support each combination frame and shadow mask above a surface of the first side of the carrier; and an alignment substrate, including the reference alignment features, positioned to a side of the combination frame and shadow mask opposite the carrier, wherein the alignment features and the reference alignment features include a first plurality of holes and a second plurality of holes, respectively; wherein the controller is operative for controlling the alignment system to individually align each combination frame and shadow mask until a predetermined amount of light passes through the first plurality of holes of said combination and the second plurality of holes associated with said combination in alignment with said first plurality of holes of said combination.

8. The system of claim 7, wherein:

each hole of the first plurality of holes aligned with one hole of the second plurality of holes are positioned along a light path;

each light path comprises a light receiver; and the controller determines from the outputs of the light receivers when the predetermined amount of light passes through the first plurality of holes and the second plurality of holes in alignment with said first plurality of holes.

9. The system of claim 8, wherein each light path further comprises a light source.

10. The system of claim 7, wherein the controller is operative for controlling the alignment system to simultaneously align each combination frame and shadow mask.

11. A multi-mask alignment system comprising:

a carrier including first and second sides and a plurality of a apertures extending through the carrier from the first side to the second side, wherein each aperture has associated therewith a combination frame and shadow mask including alignment features, wherein the shadow mask is supported via the frame on the first side of the carrier with the shadow mask in alignment with the aperture;

an alignment system positioned on the second side of the carrier;

a controller operative for controlling the alignment system to individually align each combination frame and shadow mask such that the alignment features of said combination align with reference alignment features associated with said combination but not part of the carrier or said combination; and spacers positioned on the carrier and configured to support each combination frame and shadow mask above a surface of the first side of the carrier, wherein:

the alignment system includes an alignment stage operative for moving at least one combination frame and shadow mask from a position in contact with the carrier to a position spaced from the carrier and vice versa, and for adjusting the combination frame and shadow mask in two or more of the X, Y, and θ directions;

the X and Y directions are parallel to the first side of the carrier; and the θ direction is rotational around a Z direction which is normal of the first side of the carrier.

12. The system of claim 11, wherein:

the alignment stage includes a plurality of pins extending through holes in the carrier;

when extended, the pins position the combination frame and shadow mask spaced from the carrier; and when the pins are retracted the combination frame and shadow mask is in contact with the spacers.

13. A multi-mask alignment method comprising:

(a) providing a carrier that includes a plurality of apertures therethrough;

(b) for each aperture, positioning a combination frame and shadow mask that includes alignment features on spacers supported by the carrier with the shadow mask of said combination in coarse alignment with the aperture;

(c) following step (b), an alignment system moving each combination frame and shadow mask to a position spaced from the spacers;

(d) following step (c), the alignment system individually fine or precision aligning each combination frame and shadow mask to align the alignment features of said combination with reference alignment features associated with said combination and not part of the carrier or the combination;

(e) following step (d), returning each combination frame and shadow mask to a position on the spacers; and (f) following step (e), securing each combination frame and shadow mask to the carrier, wherein at least step (d) is automatically performed under the control of a controller.

14. The method of claim 13, wherein step (d) further includes simultaneously fine or precision aligning each combination frame and shadow mask.

15. The system of claim 13, wherein the spacers are configured to planarize (i) each combination frame and shadow mask or (ii) all of the combination frames and shadow masks with respect to each other.

16. The system of claim 13, wherein:

the spacers comprise leveling pins projected through openings in the carrier; and the leveling pins are secured in the openings in the carrier.

17. The method of claim 13, wherein:

the reference alignment features associated with said combination comprise predetermined coordinates stored in a memory;

a camera is operative for acquiring images of the alignment features of said combination; and step (d) includes the controller controlling the alignment system to align the alignment features of said combination to the predetermined coordinates based on the acquired images.

18. The method of claim 13, wherein:

an alignment substrate positioned between a camera and the combination frame and shadow mask includes the reference alignment features associated with said combination;

the camera is operative for acquiring images of the alignment features of said combination and the reference alignment features associated with said combination; and step (d) includes the controller controlling the alignment system to align the alignment features associated with said combination and the reference alignment features associated with said combination based on the acquired images.

19. The method of claim 13, wherein:

an alignment substrate, including the reference alignment features, is positioned to a side of the combination frame and shadow mask opposite the carrier, wherein the alignment features and the reference alignment features include a first plurality of holes and a second plurality of holes, respectively; and step (d) includes the controller controlling the alignment system to individually align each combination frame and shadow mask until a predetermined amount of light passes through the first plurality of holes of said combination and the second plurality of holes associated with said combination in alignment with said first plurality of holes of said combination.

20. The method of claim 19, wherein:

each hole of the first plurality of holes aligned with one hole of the second plurality of holes are positioned along a light path;

each light path comprises a light receiver; and step (d) includes the controller determining from the outputs of the light receivers when the predetermined amount of light passes through the first plurality of holes of said combination and the second plurality of holes associated with said combination in alignment with said first plurality of holes of said combination.

* * * * *

UNITED STATES PATENT AND TRADEMARK OFFICE
CERTIFICATE OF CORRECTION

PATENT NO. : 10,422,030 B2  
APPLICATION NO. : 16/062395  
DATED : September 24, 2019  
INVENTOR(S) : Brian Arthur Bucci et al.

Page 1 of 1

It is certified that error appears in the above-identified patent and that said Letters Patent is hereby corrected as shown below:

In the Claims

Column 15, Line 46, Claim 11, before "apertures" delete "a"

Column 16, Line 39, Claim 15, delete "system" and insert -- method --

Column 16, Line 43, Claim 16, delete "system" and insert -- method --

Signed and Sealed this  
Fourth Day of February, 2020

Andrei Iancu  
*Director of the United States Patent and Trademark Office*